(12) United States Patent
Seo et al.

(10) Patent No.: US 11,088,700 B2
(45) Date of Patent: *Aug. 10, 2021

(54) ROLLABLE DISPLAY DEVICE AND ROLLABLE DEVICE

(71) Applicant: SAMSUNG DISPLAY CO., LTD., Yongin-si (KR)

(72) Inventors: Tae An Seo, Hwaseong-si (KR); Min-Sung Kim, Hwaseong-si (KR); Jung Hun Lee, Hwaseong-si (KR); Jin Hwan Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/879,849

(22) Filed: May 21, 2020

(65) Prior Publication Data

US 2020/0287559 A1 Sep. 10, 2020

Related U.S. Application Data

(60) Continuation of application No. 16/398,982, filed on Apr. 30, 2019, now Pat. No. 10,698,447, which is a
(Continued)

(30) Foreign Application Priority Data

Jul. 6, 2016 (KR) .......................... 10-2016-0085680

(51) Int. Cl.
*H03M 1/06* (2006.01)

(52) U.S. Cl.
CPC ................. *H03M 1/0678* (2013.01)

(58) Field of Classification Search
CPC ....................................................... G06F 1/16
See application file for complete search history.

(56) References Cited

U.S. PATENT DOCUMENTS 9,147,859 B2 9/2015 Kim et al.
9,677,742 B2 6/2017 Cho
(Continued)

FOREIGN PATENT DOCUMENTS

CN 102569347 7/2012
CN 103824526 5/2014
(Continued)

OTHER PUBLICATIONS

Chinese Office Action issued in corresponding Chinese Patent Application No. 201710546145.5 dated Sep. 27, 2020.

*Primary Examiner* — Jerry Wu
(74) *Attorney, Agent, or Firm* — F. Chau & Associates, LLC

(57) ABSTRACT

A rollable display device includes a rollable display and a first protection film disposed on a first surface of the rollable display. The first protection film extends beyond a first display edge of the rollable display. The rollable display device further includes a second protection film disposed on a second surface of the rollable display facing the first surface of the rollable display. The second protection film extends beyond the first display edge of the rollable display. The rollable display device additionally includes a first adhesive layer disposed between the rollable display and the first protection film. The rollable display device further includes second adhesive layer disposed between the rollable display and the second protection film, and a first adhesion part disposed adjacent to the first display edge of the rollable display and between the first protection film and the second protection film.

18 Claims, 9 Drawing Sheets

Related U.S. Application Data division of application No. 15/636,763, filed on Jun. 29, 2017, now Pat. No. 10,303,217.

(56) References Cited

U.S. PATENT DOCUMENTS

| | | |
|---|---|---|
| 9,730,318 B2 | 8/2017 | Choi et al. |
| 9,741,961 B2 | 8/2017 | Kim et al. |
| 9,971,206 B2 | 5/2018 | Wang |
| 10,303,217 B2 | 5/2019 | Seo et al. |
| 2003/0184704 A1 | 10/2003 | Akiyama et al. |
| 2011/0007042 A1* | 1/2011 | Miyaguchi ............ H01L 23/562 345/204 |
| 2015/0155505 A1* | 6/2015 | Yamazaki ............... H01L 29/24 257/40 |
| 2015/0200375 A1 | 7/2015 | Kim et al. |
| 2015/0314561 A1 | 11/2015 | Kim et al. |
| 2016/0101593 A1 | 4/2016 | Nam et al. |
| 2016/0120023 A1 | 4/2016 | Choi et al. |
| 2016/0170443 A1 | 6/2016 | Namkung et al. |
| 2016/0224066 A1 | 8/2016 | Hussa |
| 2018/0011516 A1 | 1/2018 | Seo et al. |
| 2019/0258296 A1 | 8/2019 | Seo et al. |

FOREIGN PATENT DOCUMENTS

| | | |
|---|---|---|
| CN | 104779266 | 7/2015 |
| CN | 105185239 | 12/2015 |
| CN | 105551385 | 5/2016 |
| KR | 10-2000-0001014 | 1/2000 |
| KR | 10-2011-0097743 | 8/2011 |
| KR | 10-2014-0005404 | 1/2014 |
| KR | 10-2014-0080238 | 6/2014 |
| KR | 10-1570869 | 11/2015 |

\* cited by examiner

ROLLABLE DISPLAY DEVICE AND ROLLABLE DEVICE

CROSS-REFERENCE TO RELATED APPLICATIONS

This application is a continuation of U.S. patent application Ser. No. 16/398,982 filed on Apr. 30, 2020, which is a divisional of U.S. patent application Ser. No. 15/636,763, filed on Jun. 29, 2017, now U.S. Pat. No. 10,303,217, issued on May 28, 2019, which claims priority under 35 U.S.C. § 119 to Korean Patent Application No. 10-2016-0085680 filed on Jul. 6, 2016 in the Korean Intellectual Property Office, the disclosures of which are incorporated by reference herein in their entireties.

TECHNICAL FIELD

One or more exemplary embodiments of the present inventive concept relate to a display apparatus, and more particularly, to a rollable display device and a rollable device.

DISCUSSION OF THE RELATED ART

A display device is a device displaying an image, and a rollable display device has been under development.

The rollable display device is a device including a rollable display that is made of a flexible material and may be rolled around a roller or may be unrolled from the roller. The rollable display may be rolled around the roller so that a size of the entire rollable display device may be reduced, thereby being portable.

SUMMARY

An exemplary embodiment provides a rollable display device and a rollable device suppressing a strain due to a stress generated when being rolled to a roller.

According to an exemplary embodiment of the present inventive concept, a rollable display device includes a rollable display and a first protection film disposed on a first surface of the rollable display. The first protection film extends beyond a first display edge of the rollable display. The rollable display device further includes a second protection film disposed on a second surface of the rollable display facing the first surface of the rollable display. The second protection film extends beyond the first display edge of the rollable display. The rollable display device additionally includes a first adhesive layer disposed between the rollable display and the first protection film. The rollable display device further includes second adhesive layer disposed between the rollable display and the second protection film, and a first adhesion part disposed adjacent to the first display edge of the rollable display and between the first protection film and the second protection film.

According to an exemplary embodiment of the present inventive concept, a rollable display device, and a roller extending in a first direction and fixed to a first edge of the rollable display device. The first edge extends in the first direction. The rollable display device includes a rollable display. A first display edge of the rollable display is supported by the roller. The rollable display device further includes a first protection film disposed on a first surface of the rollable display. The first protection film extends beyond the first display edge of the rollable display. The rollable display device additionally includes a second protection film disposed on a second surface of the rollable display facing the first surface of the rollable display. The second protection film extends beyond the first display edge of the rollable display. The rollable display device further includes a first adhesive layer disposed between the rollable display and the first protection film, a second adhesive layer disposed between the rollable display and the second protection film, and a first adhesion part disposed adjacent to the first display edge and between the first protection film and the second protection film.

According to an exemplary embodiment, the rollable display device and the rollable device of which deformation due to stress generated when being rolled to the roller is suppressed are provided.

DETAILED DESCRIPTION OF THE EMBODIMENTS

Figure 1:
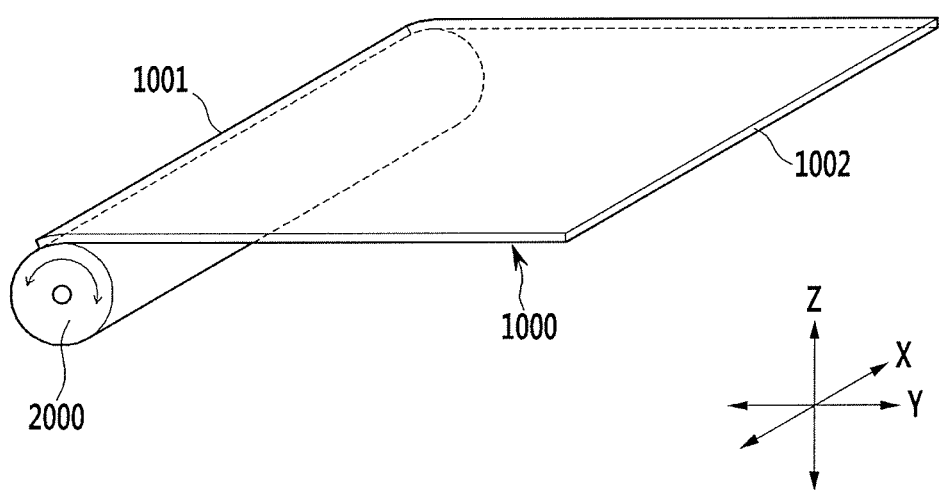
FIG. 1 is a perspective view of a rollable device according to an exemplary embodiment of the present inventive concept.

Exemplary embodiments of the present inventive concept will be described more fully hereinafter with reference to the accompanying drawings.

In order to clearly explain the present invention, the same reference numerals are attached to the same or similar constituent elements through the entire specification.

The drawings and description are to be regarded as illustrative in nature and not restrictive. In the drawings, the thickness of layers, films, panels, regions, etc., may be exaggerated for clarity. In addition, in the drawings, for better understanding and ease of description, the thicknesses of some layers and areas may be exaggerated.

It will be understood that when an element such as a layer, film, region, or substrate is referred to as being "on" another element, it may be directly on the other element or intervening elements may also be present. Further, throughout the specification, "on" implies being positioned above or below a target element and does not imply being necessarily positioned on the top in a gravity direction.

Now, a rollable device according to an exemplary embodiment will be described with reference to FIG. 1.

FIG. 1 is a perspective view of a rollable device according to an exemplary embodiment of the present inventive concept.

As shown in FIG. 1, the rollable device according to an exemplary embodiment of the present inventive concept includes a roller 2000 and a rollable display device 1000.

The roller 2000 extends in a first direction (e.g., x-axis direction). The roller 2000 rotates in a counterclockwise direction, and the rollable display device 1000 may be rolled towards and around the roller 2000 in a second direction (e.g., y-axis direction) crossing the first direction. The roller 2000 rotates in a clockwise direction and the rollable display device 1000 may be unrolled from the roller 2000 in the second direction. However, exemplary embodiments of the present inventive concept are not limited thereto. For example, the roller 2000 may rotate in the clockwise direction, and rollable display device 1000 may be rolled towards and around the roller 2000 in a second direction. Alternatively, the roller 2000 may rotate in the counterclockwise direction, and the rollable display device 1000 may be unrolled from the roller 2000 in the second direction. A third direction (e.g., z-axis direction) is a direction crossing the first direction X and the second direction Y, and may be a thickness direction of the rollable display device 1000. Further, the third direction may extend in a direction perpendicular to the first direction and the second direction.

The rollable display device 1000 displays an image. The rollable display device 1000 may be rolled to the roller 2000 in the second direction, and may be unrolled from the roller 2000 in the second direction. The rollable display device 1000 includes a first device edge 1001 that is at one end along the first direction and a second device edge 1002 that is opposite to the first device edge 1001 along the first direction. The first device edge 1001 may be fixed to the roller 2000, and the second device edge 1002 may be rolled toward the roller 2000, when the rollable display device 1000 is being rolled to the roller 2000, or may be unrolled away from the roller 2000, when the rollable display device 1000 is being unrolled from the roller 2000.

Next, the rollable display device 1000 according to an exemplary embodiment of the present inventive concept will be described with reference to FIG. 2 and FIG. 3. The rollable display device according to an exemplary embodiment of the present inventive concept is a rollable display device 1000 included in the above-described rollable display device 1000 according to an exemplary embodiment of the present inventive concept.

Figure 2:
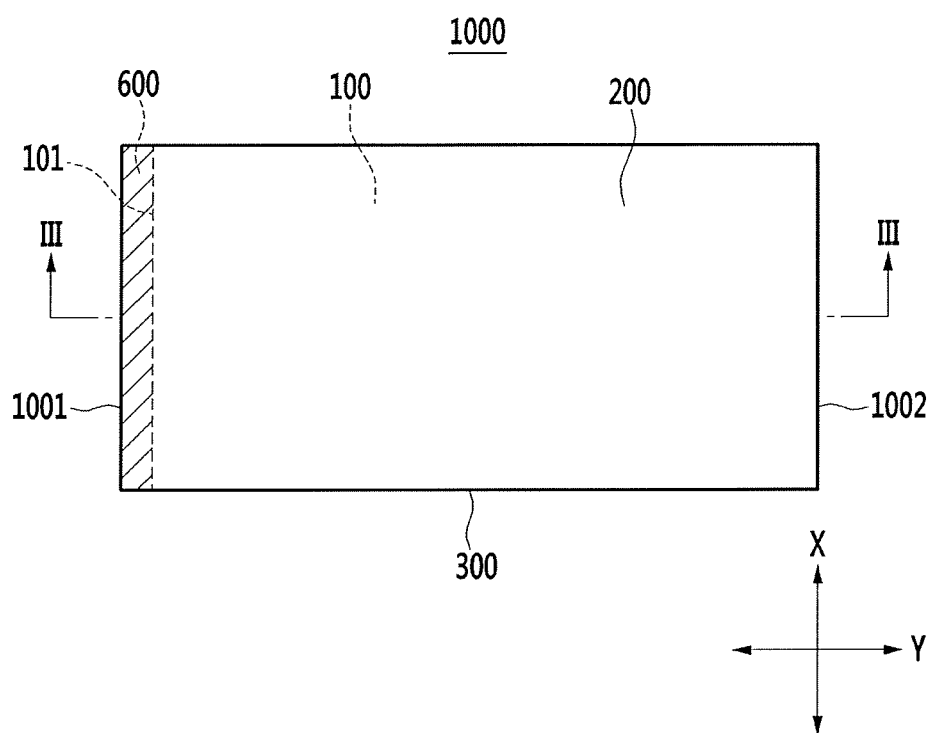
FIG. 2 is a top plan view of a rollable display device according to an exemplary embodiment of the present inventive concept.

FIG. 2 is a top plan view of a rollable display device according to an exemplary embodiment of the present inventive concept. FIG. 3 is a cross-sectional view taken along a line III-III shown in FIG. 2.

Figure 3:
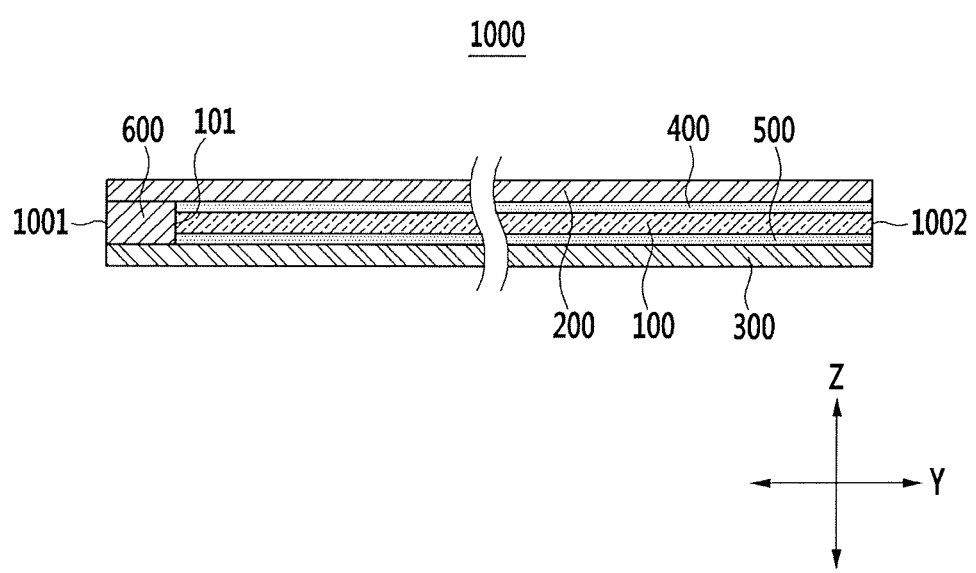
FIG. 3 is a cross-sectional view taken along a line III-Ill shown in FIG. 2.

As shown in FIG. 2 and FIG. 3, the rollable display device 1000 may include the rollable display 100, a first protection film 200, a second protection film 300, a first adhesive layer 400, a second adhesive layer 500, and a first adhesion part 600.

The rollable display 100 may include flexible substrates and/or films that may face one another. In addition, the rollable display 100 may include a liquid crystal layer, an organic light emitting diodes, an electronic ink, or the like. The rollable display 100 may be a transparent type or a light transmissive type. The rollable display 100 may include a touch sensor. The touch sensor may be, for example, a touch sensor film, a touch sheet, a touch pad, or the like. The touch sensor may sense a touch input on a surface (e.g., a front surface) of the rollable display 100. The rollable display 100 includes a first display edge 101 that is one end portion of the rollable display 100 and extends along the first direction. The first display edge 101 of the rollable display 100 is adjacent to the first device edge 1001 of the rollable display device 1000. The first device edge 1001 of the rollable display device 1000 extends along the first direction. The first display edge 101 of the rollable display 100 is supported by the roller 2000 by fixing the first device edge 1001 of the rollable display device 1000 to the roller 2000.

The first protection film 200 is disposed on the front surface of the rollable display 100. The first protection film 200 may cover the rollable display 100. Further, the first protection film 200 covers the first display edge 101 of the rollable display 100. In addition, the first protection film 200 extends in the second direction and beyond the first display edge 101 of the rollable display 100.

The second protection film 300 is disposed on a lower surface of the rollable display 100. The second protection film 300 covers the rollable display 100. Further, the second protection film 300 covers the first display edge 101 of the rollable display 100. In addition, the second protection film 300 extends in the second direction and beyond the first display edge 101 of the rollable display 100.

As the second protection film 300 and the first protection film 200 extend beyond the first display edge 101, a space is formed between the second protection film 300 and the first protection film 200. Further, the space corresponds to the first display edge 101. For example, the space is adjacent to the first display edge 101. The first adhesion part 600 is disposed in the space formed between the second protection film 300 and the first protection film 200.

The first adhesive layer 400 is disposed between the rollable display 100 and the first protection film 200. The first adhesive layer 400 is in contact with the rollable display 100 and the first protection film 200. The first protection film 200 is adhered to the front surface of the rollable display 100 by the first adhesive layer 400.

The second adhesive layer 500 is disposed between the rollable display 100 and the second protection film 300. The second adhesive layer 500 is in contact with the rollable display 100 and the second protection film 300. The second protection film 300 is adhered to the lower surface of the rollable display 100 by the second adhesive layer 500.

The first adhesive layer 400 and the second adhesive layer 500 include a pressure sensitive adhesive so that one configuration may be attached to or detached from other configurations. The first adhesive layer 400 and the second adhesive layer 500 have an adhesive force. The first adhesive layer 400 and second adhesive layer 500 be sticky (e.g., may stick to a configuration). The first adhesive layer 400 has a higher adhesion strength than that of the first adhesion part 600. Further, the second adhesive layer 500 has a higher adhesion strength than that of the first adhesion part 600.

The first adhesion part 600 is adjacent to the first display edge 101. The first adhesion part 600 is disposed in a space formed by the first protection film 200, the second protection film 300 and the first display edge 101. The first adhesion part 600 may be in contact with the first protection film 200, the second protection film 300 and the first display edge 101, which is between the first protection film 200 and the second protection film 300.

The first adhesion part 600 includes an adhesive selected from, for example, at least one among polyurethane, silicon, acryl, and the like, of which the adherence may be provided in a manufacturing process of the rollable display device 1000, but the adherence may be eliminated after the manufacturing of the rollable display device 1000. Since the adherence of the first adhesion part 600 may be eliminated after the manufacturing of the rollable display device 1000, the adhesion strength of the first adhesive layer 400 is then higher than that of the first adhesion part 600 and adhesion strength of the second adhesive layer 500 is then higher than that of the first adhesion part 600.

The first adhesion part 600 may be cured by a curing means such as by applying ultraviolet rays or heat in the manufacturing process of the rollable display device 1000. The first adhesion part 600 has a large modulus of elasticity. The first adhesion part 600 may include an elastomer with a larger modulus of elasticity than that of the first adhesive layer 400 and the second adhesive layer 500. The first adhesion part 600 extends in the first direction parallel to the first display edge 101.

Next, an effect of the rollable display device according to an exemplary embodiment of the present inventive concept will be described with reference to FIG. 4 and FIG. 5.

Figure 4:
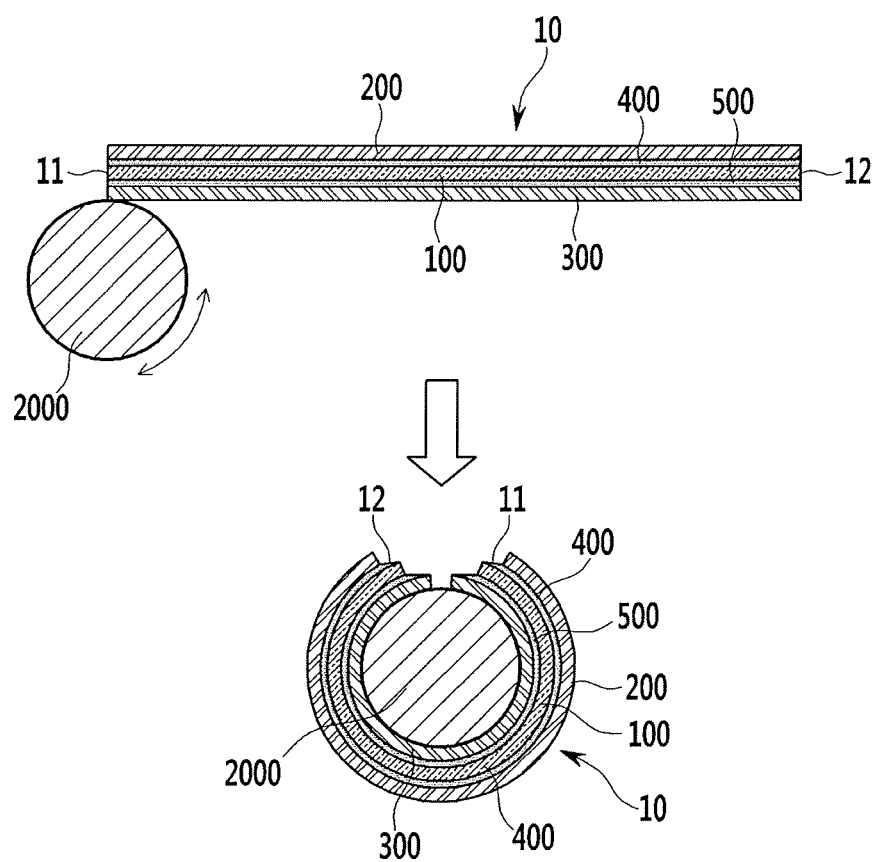
FIG. 4 and FIG. 5 are cross-sectional views to explain an effect of a rollable display device according to an exemplary embodiment of the present inventive concept.
Figure 5:
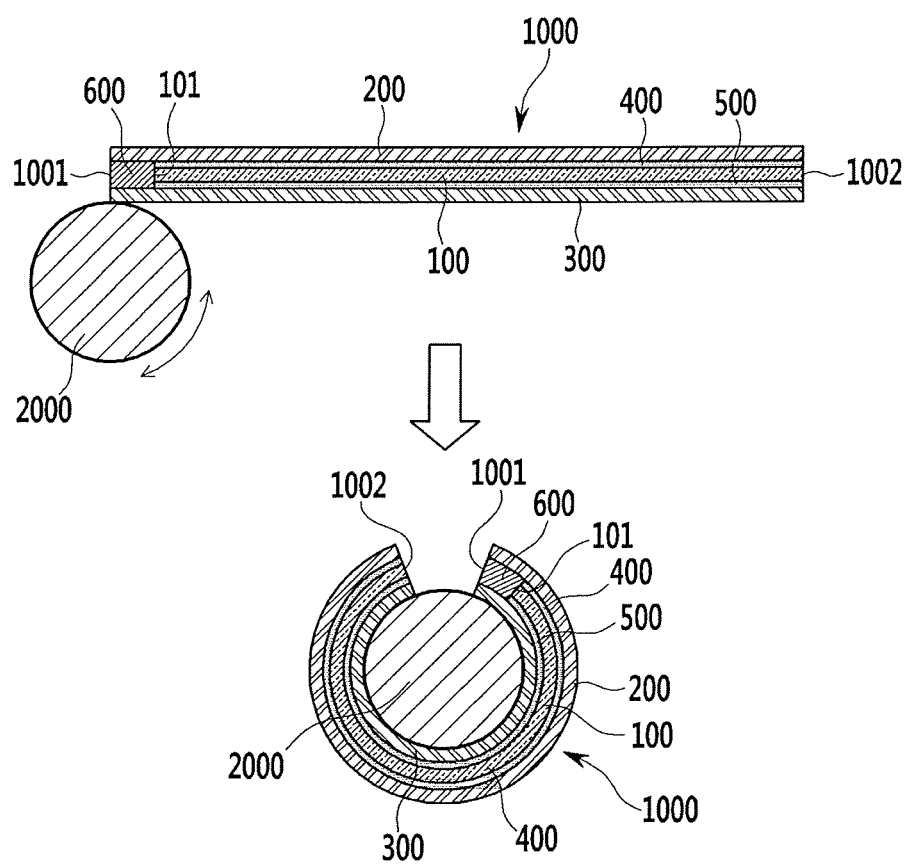

FIG. 4 and FIG. 5 are cross-sectional views to explain an effect of a rollable display device 1000 according to an exemplary embodiment of the present inventive concept. FIG. 4 is a cross-sectional view showing a rollable display device 10 without the first adhesion part 600.

As shown in FIG. 4, the rollable display device 10 without the first adhesion part 600 includes a first edge 11, extending in the first direction, fixed to the roller 2000 and a second edge 12, extending in the first direction, that may be unrolled away from the roller 2000. In other words, the first edge 11 is the end of the rollable display device 10 nearest the roller 2000, and the second edge 12 is the end of the rollable display device 10 opposite that of the first edge 11.

If the rollable display device 10 is rolled around the roller 2000, stress may be generated in the rollable display device 10. For example, as the rollable display 100, the first protection film 200, and the second protection film 300 of the rollable display device 10 are rolled around the roller 2000, stress may be generated in the first adhesive layer 400 disposed between the rollable display 100 and the first protection film 200 and in the second adhesive layer 500 disposed between the rollable display 100 and the second protection film 300.

Because of this stress, a strain such as a shear strain may be generated in the first adhesive layer 400 and the second adhesive layer 500 that have adhesive.

As described above, as the strain is generated in the first adhesive layer 400 and the second adhesive layer 500, at least a portion of the first protection film 200 and/or the second protection film 300 may be separated from the rollable display 100.

Also, in a state that the first adhesive layer 400 and the second adhesive layer 500 may be strained, as the first protection film 200 and the second protection film 300 are attached to the rollable display 100 and the rollable display device 10 is unrolled from the roller 2000, the rollable display device 10 is not unrolled to be substantially flat, but is unrolled to be in a curved state.

FIG. 5 is a view of a rollable display device according to an exemplary embodiment of the present inventive concept including a first adhesion part 600.

As shown in FIG. 5, the rollable display device 1000 according to an exemplary embodiment of the present inventive concept, including the first adhesion part 600, includes the first device edge 1001 fixed to the roller 2000 and the second device edge 1002 that may be unrolled from the roller 2000. Further, the second device edge 1002 of the rollable display device 1000 is opposite to the first device edge 1001 of the rollable display device 1000.

If the rollable display device 1000 is rolled around the roller 2000, stress may be generated in the rollable display device 1000. For example, as the rollable display 100, the first protection film 200 and the second protection film 300 of the rollable display device 1000 are rolled around the roller 2000, and stress may be generated in the first adhesive layer 400 disposed between the rollable display 100 and the first protection film 200 and in the second adhesive layer 500 disposed between the rollable display 100 and the second protection film 300.

According to an exemplary embodiment of the present inventive concept, if the stress is generated in the first adhesive layer 400 and the second adhesive layer 500, the strain due to the stress may be suppressed from being generated in the first adhesive layer 400 and second adhesive layer 500. The strain may be reduced or suppressed by an adhesion part 600 being in contact with and adhered to the first display edge 101, the first protection film 200, and the second protection film 300.

Also, as the first adhesion part 600 includes the elastomer having a larger modulus of elasticity than that of the first adhesive layer 400 and the second adhesive layer 500 and since elastic deformation is generated in the state when the first adhesion part 600 is adhered to the first display edge 101 of the rollable display 100, the first protection film 200, and the second protection film 300 because of the stress generated due to the bending of the rollable display device 1000 (e.g., rollable display 100, the first protection film 200, and the second protection film 300), the stress generated in the first adhesive layer 400 and the second adhesive layer 500 may deteriorate such that the strain, such as the shear strain, may be reduced or suppressed in the first adhesive layer 400 and the second adhesive layer 500.

As described above, as deformation of the first adhesive layer 400 and the second adhesive layer 500, by being bent, is suppressed, at least one portion of the first protection film 200 and the second protection film 300 is prevented from being separated from the rollable display 100.

Also, in a state that the first adhesive layer 400 and the second adhesive layer 500 are not deformed, as the first protection film 200 and the second protection film 300 adhere to the rollable display 100 and the rollable display device 1000 is unrolled from the roller 2000, the rollable display device 1000 does not maintain the curved state, but is unrolled into a substantially flat state.

Accordingly, the rollable display device 1000 that reduces or suppresses deformation due to the stress generated when being rolled to the roller 2000 is provided.

Next, the rollable display device according to an exemplary embodiment of the present inventive concept will be described with reference to FIG. 6. Hereinafter, differences from the above-described rollable display device 1000 according to an exemplary embodiment of the present inventive concept will be described.

Figure 6:
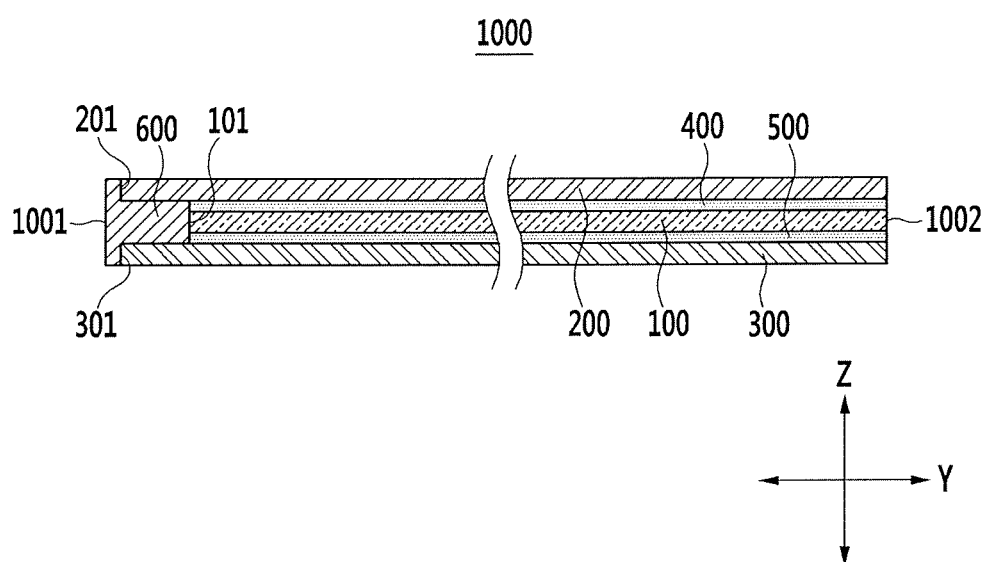
FIG. 6 is a cross-sectional view of a rollable display device according to an exemplary embodiment of the present inventive concept.

FIG. 6 is a cross-sectional view of a rollable display device according to an exemplary embodiment of the present inventive concept.

As shown in FIG. 6, the rollable display device 1000, according to an exemplary embodiment of the present inventive concept, includes the rollable display 100, the first protection film 200, the second protection film 300, the first adhesive layer 400, the second adhesive layer 500, and the first adhesion part 600.

The first adhesion part 600 extends beyond an edge 201 of the first protection film 200 and an edge 301 of the second protection film 300 from between the first protection film 200 and the second protection film 300. The first adhesion part 600 is in contact with the edge 201 of the first protection film 200 and the edge 301 of the second protection film 300. The first adhesion part 600 has a "T"-like shape; however exemplary embodiments are not limited thereto.

As described above, in the rollable display device 1000 according to an exemplary embodiment of the present inventive concept, the first adhesion part 600 is in contact with the first display edge 101 of the rollable display 100, the first protection film 200, and the second protection film 300, and is simultaneously in contact with the edge 201 of the first protection film 200 and the edge 301 of the second protection film 300. Further, the first adhesion part 600 adheres to the first display edge 101, the first protection film 200, and the second protection film 300, such that the strain, such as the shear strain, is suppressed from being generated in the first adhesive layer 400 and the second adhesive layer 500 with the adhesive.

Accordingly, the rollable display device 1000 that reduces or suppresses a deformation due to the stress generated when being rolled to the roller is provided.

Next, the rollable display device 1000 according to an exemplary embodiment of the present inventive concept will be described with reference to FIG. 7. Hereinafter, differences from the above-described rollable display device 1000 according to an exemplary embodiment of the present inventive concept will be described.

Figure 7:
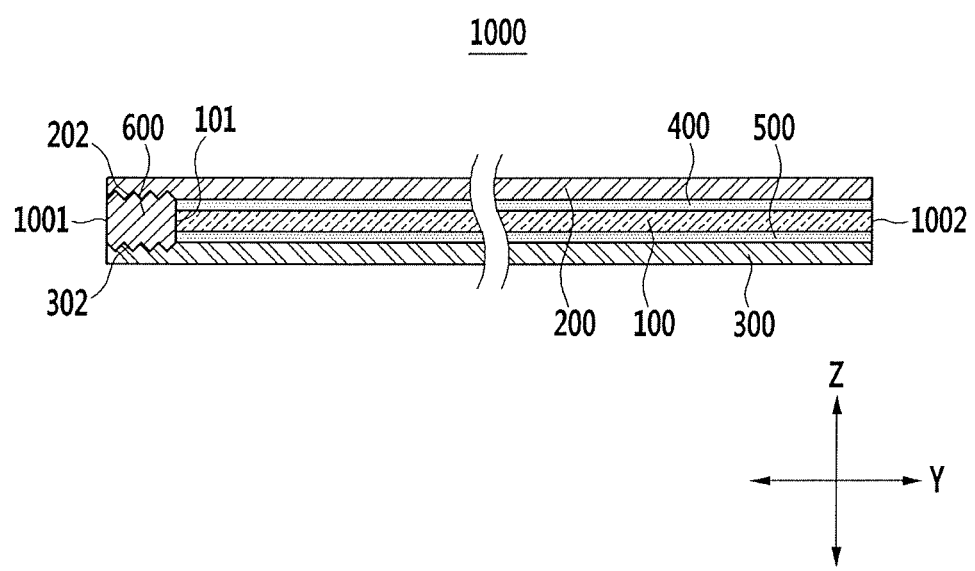
FIG. 7 is a cross-sectional view of a rollable display device according to an exemplary embodiment of the present inventive concept.

FIG. 7 is a cross-sectional view of a rollable display device 1000 according to another exemplary embodiment of the present inventive concept.

As shown in FIG. 7, the rollable display device 1000, according to an exemplary embodiment of the present inventive concept, includes the rollable display 100, the first protection film 200, the second protection film 300, the first adhesive layer 400, the second adhesive layer 500, and the first adhesion part 600.

A surface 202 of the first protection film 200 in contact with an upper surface of the first adhesion part 600 and a surface 302 of the second protection film 300 in contact with a lower surface of the first adhesion part 600, and both surfaces 202 and 302 have protrusions and depressions in an alternating arrangement. The upper and lower surfaces of the first adhesion part 600 have protrusions and depressions in an alternating arrangement that corresponds to the surface 202 of the first protection film 200 and the surface 302 of the second protection film 300. For example, a protrusion from the upper surface of the first adhesion part 600 corresponds to (e.g., fits into) a depression of the surface 202 of the first protection film 200.

Accordingly, in the rollable display device 1000 according to an exemplary embodiment of the present inventive concept, as the first adhesion part 600 is in contact with the first protection film 200 and the second protection film 300 with the protrusions and depressions in an alternating arrangement while being in contact with the first display edge 101 of the rollable display 100 and since a contact area between the first adhesion part 600 and the first protection film 200 and a contact area between the first adhesion part 600 and the second protection film 300 are both increased, the first display edge 101, the first protection film 200, and the second protection film 300 are firmly adhered to one another and the first adhesion part 600. Accordingly, the strain, such as the shear strain, is suppressed from being generated in the first adhesive layer 400 and the second adhesive layer 500 with the adhesive.

Accordingly, the rollable display device 1000 that reduces or suppresses deformation due to the stress generated when being rolled to the roller 2000 is provided.

Next, the rollable display device 1000 according to an exemplary embodiment of the present inventive concept will be described with reference to FIG. 8. Hereinafter, differences from the above-described rollable display device 1000 according to an exemplary embodiment of the present inventive concept will be described.

Figure 8:
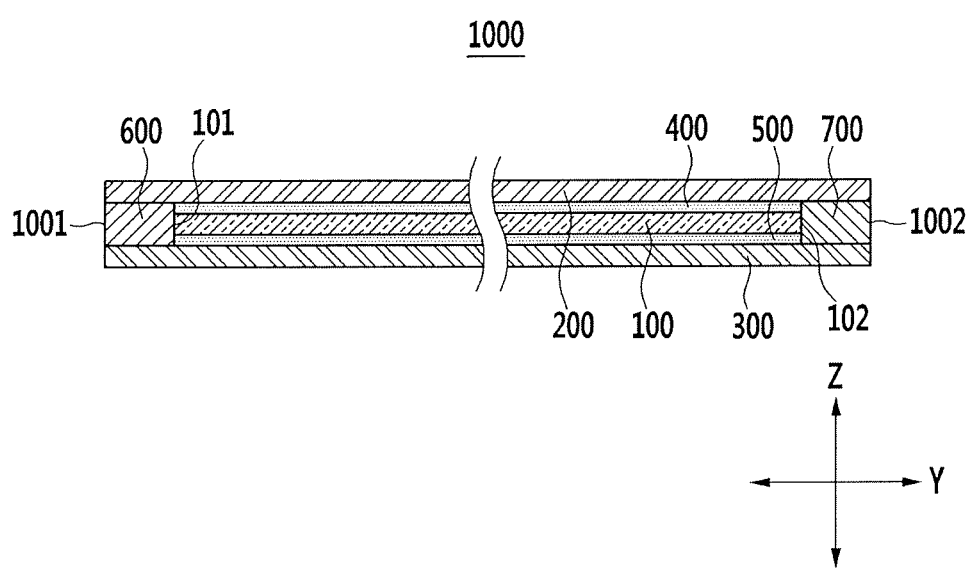
FIG. 8 is a cross-sectional view of a rollable display device according to an exemplary embodiment of the present inventive concept.

FIG. 8 is a cross-sectional view of a rollable display device 1000 according to an exemplary embodiment of the present inventive concept.

As shown in FIG. 8, the rollable display device 1000, according to an exemplary embodiment of the present inventive concept, includes the rollable display 100, the first protection film 200, the second protection film 300, the first adhesive layer 400, the second adhesive layer 500, the first adhesion part 600, and the second adhesion part 700.

The rollable display 100 includes a second display edge 102 opposite the first display edge 101 of the rollable display 100 extending in the first direction. The second display edge 102 of the rollable display 100 is adjacent to the second device edge 1002 of the rollable display device 1000 that extends in the first direction. The second display edge 102 of the rollable display 100 is a part that is unrolled away from the above-described roller 2000. The second display edge 102 of the rollable display 100 extends in the first direction crossing the second direction Y.

The first protection film 200 covers the second display edge 102 of the rollable display 100. In addition, the first protection film 200 extends in the second direction and beyond the second display edge 102 of the rollable display 100.

The second protection film 300 covers the second display edge 102 of the rollable display 100. In addition, the second protection film 300 extends in the second direction and beyond the second display edge 102 of the rollable display 100.

As the second protection film 300 and the first protection film 200 extend beyond the second display edge 102, a space is formed between the second protection film 300 corresponding to the second display edge 102 and the first protection film 200. The second adhesion part 700 is disposed in the space formed between the second protection film 300 and the first protection film 200.

The second adhesion part 700 is adjacent to the second display edge 102. The second adhesion part 700 is disposed at the space formed by the first protection film 200, the second protection film 300, and the second display edge 102. The second adhesion part 700 may be in contact with the first protection film 200, the second protection film 300, and the second display edge 102, which is between the first protection film 200 and the second protection film 300.

The second adhesion part 700 includes the adhesive selected from, for example, at least one among polyurethane, silicon, acryl, and the like, that has the adherence in the manufacturing process of the rollable display device 1000, but the adherence may be eliminated after the manufacturing of the rollable display device 1000. Since the adherence of the second adhesion part 700 may be eliminated after the manufacturing of the rollable display device 1000, the first adhesive layer 400 and the second adhesive layer 500 each have a greater adhesion strength than that of the second adhesion part 700.

The second adhesion part 700 may be cured by the curing means such as by applying ultraviolet rays or heat in the manufacturing process of the rollable display device 1000. The second adhesion part 700 has a large modulus of elasticity. The second adhesion part 700 may include the elastomer with a larger modulus of elasticity than that of the first adhesive layer 400 and the second adhesive layer 500. The second adhesion part 700 extends in the first direction parallel to the second display edge 102.

The second adhesion part 700 may have a different modulus of elasticity from the first adhesion part 600. For example, the second adhesion part 700 may have a larger modulus of elasticity than that of the first adhesion part 600. As another example, the second adhesion part 700 may have a smaller modulus of elasticity than that of the first adhesion part 600.

As described above, for the rollable display device 1000 according to an exemplary embodiment of the present inventive concept, if the rollable display device 1000 is rolled around the roller 2000, (e.g., as the rollable display 100, the first protection film 200, and the second protection film 300 of the rollable display device 1000 are rolled around the roller) stress is generated in the first adhesive layer 400 disposed between the rollable display 100 and the first protection film 200 and in the second adhesive layer 500 disposed between the rollable display 100 and the second protection film 300.

Although the stress is generated, the first adhesion part 600 is in contact with and adhered between the first display edge 101, the first protection film 200, and the second protection film 300, such that the strain, such as the shear strain, is suppressed from being generated in the first adhesive layer 400 and the second adhesive layer 500 with the adhesive. Further, the second adhesion part 700 is in contact with and adhered between the second display edge 102 of the rollable display 100 unrolled from the roller, the first protection film 200, and the second protection film 300, such that the strain, such as the shear strain, is suppressed from being generated in the first adhesive layer 400 and the second adhesive layer 500 with the adhesive.

Also, as the first adhesion part 600 and the second adhesion part 700 each includes the elastomer having the larger modulus of elasticity than that of the first adhesive layer 400 and the second adhesive layer 500 and since the elastic deformation is generated in the state when the first adhesion part 600 and the second adhesion part 700 adhere to the first and second display edge 101 and 102 of the rollable display 100, respectively, the first protection film 200, and the second protection film 300 because of the stress generated due to the bending of the rollable display 100, the first protection film 200, and the second protection film 300, the stress generated in the first adhesive layer 400 and the second adhesive layer 500 is reduced such that the deformation, such as the shear strain, is suppressed from being generated in the first adhesive layer 400 and the second adhesive layer 500.

As described above, as deformation of the first adhesive layer 400 and the second adhesive layer 500, by being bent, is suppressed, at least one portion of the first protection film 200 and the second protection film 300 is prevented from being separated from the rollable display 100.

Also, as the first protection film 200 and the second protection film 300 are attached to the rollable display 100 in the state that the first adhesive layer 400 and the second adhesive layer 500 are not deformed, even if the rollable display device 1000 is unrolled from the roller, the rollable display device 1000 does not maintain the curved state, but is unrolled into the substantially flat state.

Accordingly, the rollable display device 1000 that reduces or suppresses deformation due to the stress generated when being rolled to the roller 2000 is provided.

Next, the rollable display device 1000 according to an exemplary embodiment of the present inventive concept will be described with reference to FIG. 9. Hereinafter, differences from the rollable display device 1000 according to an exemplary embodiment of the present inventive concept will be described.

Figure 9:
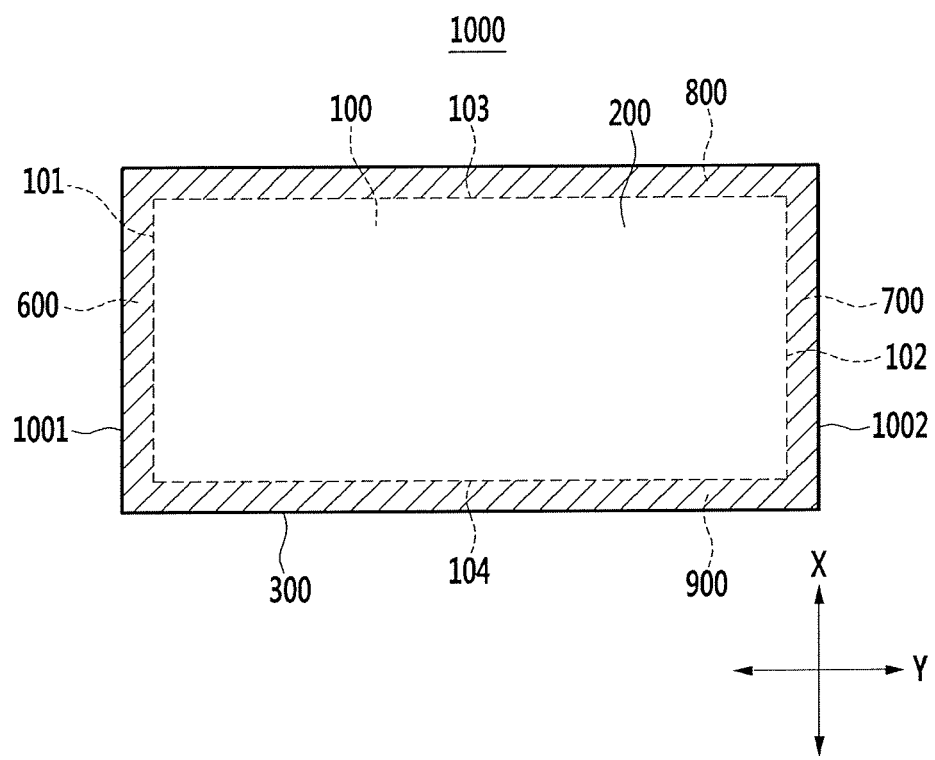
FIG. 9 is a cross-sectional view of a rollable display device according to an exemplary embodiment of the present inventive concept.

FIG. 9 is a cross-sectional view of a rollable display device 1000 according to an exemplary embodiment of the present inventive concept.

As shown in FIG. 9, the rollable display device 1000 according to an exemplary embodiment of the present inventive concept includes the rollable display 100, the first protection film 200, the second protection film 300, the first adhesive layer 400, the second adhesive layer 500, the first adhesion part 600, a second adhesion part 700, a third adhesion part 800, and a fourth adhesion part 900.

The rollable display 100 includes the second display edge 102 opposite the first display edge 101 of the rollable display 100 extending in the first direction, a third display edge 103 connecting the first display edge 101 and the second display edge 102, and a fourth display edge 104 opposite the third display edge 103 extending in the second direction and connecting the first display edge 101 and the second display edge 102.

The first protection film 200 covers the first display edge 101, the second display edge 102, the third display edge 103, and the fourth display edge 104 of the rollable display 100. In addition, the first protection film 200 extends in the second direction and beyond the first display edge 101 and the second display edge 102 of the rollable display 100. Further, the first protection film 200 extends in the first direction and beyond the third display edge 103 and the forth display edge 104 of the rollable display 100.

The second protection film 300 covers the first display edge 101, the second display edge 102, the third display edge 103, and the fourth display edge 104 of the rollable display 100. In addition, the second protection film 300 extends in the second direction and beyond the first display edge 101 and the second display edge 102 of the rollable display 100. Further, the second protection film 300 extends in the first direction and beyond the third display edge 103 and the forth display edge 104 of the rollable display 100.

As the second protection film 300 and the first protection film 200 extends beyond the first display edge 101, the second display edge 102, the third display edge 103, and the fourth display edge 104, a space is formed between the second protection film 300 and the first protection film 200 that corresponds to the first display edge 101, the second display edge 102, the third display edge 103, and the fourth display edge 104. The first adhesion part 600, the second adhesion part 700, the third adhesion part 800, and the fourth adhesion part 900 are disposed in the space formed between the second protection film 300 and the first protection film 200 corresponding (e.g., adjacent) to the first display edge 101, the second display edge 102, the third display edge 103, and the fourth display edge 104 of the rollable display 100.

The second adhesion part 700 is in contact with the first protection film 200, the second protection film 300, and the second display edge 102 between the first protection film 200 and the second protection film 300.

The third adhesion part 800 is in contact with the first protection film 200, the second protection film 300, and the third display edge 103 between the first protection film 200 and the second protection film 300.

The fourth adhesion part 900 is in contact with the first protection film 200, the second protection film 300, and the fourth display edge 104 between the first protection film 200 and the second protection film 300.

The first adhesion part 600, the second adhesion part 700, the third adhesion part 800, and the fourth adhesion part 900 are connected with one another and may be integrally formed. However, exemplary embodiments of the present inventive concept are not limited thereto. For example, the first adhesion part 600, the second adhesion part 700, the third adhesion part 800, and the fourth adhesion part 900 may be separate from one another.

The first adhesion part 600, the second adhesion part 700, the third adhesion part 800, and the fourth adhesion part 900 include the adhesive including at least one among, for example, polyurethane, silicon, acryl, and the like, that has the adherence in the manufacturing process of the rollable display device 1000, but the adherence may be eliminated after the manufacturing of the rollable display device 1000. Since the adherence of the first adhesion part 600, the second adhesion part 700, the third adhesion part 800, and the fourth adhesion part 900 may be eliminated after the manufacturing of the rollable display device 1000, the first adhesive layer 400 and the second adhesive layer 500 each have a greater adhesion strength than that of the first adhesion part 600, the second adhesion part 700, the third adhesion part 800, and the fourth adhesion part 900.

The first adhesion part 600, the second adhesion part 700, the third adhesion part 800, and the fourth adhesion part 900 may be cured by the curing means such as by applying ultraviolet rays or heat in the manufacturing process of the rollable display device 1000. The first adhesion part 600, the second adhesion part 700, the third adhesion part 800, and the fourth adhesion part 900 have the large modulus of elasticity. The first adhesion part 600, the second adhesion part 700, the third adhesion part 800, and the fourth adhesion part 900 may include the elastomer having a larger modulus of elasticity than that of the first adhesive layer 400 and the second adhesive layer 500.

As described above, for the rollable display device 1000 according to an exemplary embodiment of the present inventive concept, if the rollable display device 1000 is rolled around the roller 2000, (e.g., as the rollable display 100, the first protection film 200, and the second protection film 300 of the rollable display device 1000 are rolled around the roller 2000) stress is generated in the first adhesive layer 400 disposed between the rollable display 100 and the first protection film 200 and in the second adhesive layer 500 disposed between the rollable display 100 and the second protection film 300.

Although the stress is generated, the first adhesion part 600, the second adhesion part 700, the third adhesion part 800, and the fourth adhesion part 900 adhere respectively between the first display edge 101, the first protection film 200, and the second protection film 300, between the second display edge 102, the first protection film 200, and the second protection film 300, between the third display edge 103, the first protection film 200, and the second protection film 300, and between the fourth display edge 104, the first protection film 200, and the second protection film 300. Accordingly, the strain, such as the shear strain, is suppressed from being generated in the first adhesive layer 400 and the second adhesive layer 500 with the adhesive.

Also, as the first adhesion part 600, the second adhesion part 700, the third adhesion part 800, and the fourth adhesion part 900 each include the elastomer having the larger modulus of elasticity than that of the first adhesive layer 400 and the second adhesive layer 500 and since the elastic deformation is generated in the state when the first adhesion part 600, the second adhesion part 700, the third adhesion part 800, and the fourth adhesion part 900 adhere to the display edges (101, 102, 103, and 104) of the rollable display 100, respectively, the first protection film 200, and the second protection film 300 because of the stress generated due to the rolling (e.g., bending) of the rollable display 100, the first protection film 200, and the second protection film 300, the stress generated in the first adhesive layer 400 and the second adhesive layer 500 may deteriorates such that the deformation, such as the shear strain, is suppressed from being generated in the first adhesive layer 400 and the second adhesive layer 500.

As described above, as deformation of the first adhesive layer 400 and the second adhesive layer 500, by being bent, is suppressed, at least one portion of the first protection film 200 and the second protection film 300 is prevented from being separated from the rollable display 100.

Also, in a state that the first adhesive layer 400 and the second adhesive layer 500 are not deformed, the rollable display device 1000 may not maintain the curved state. For example, as the first protection film 200 and the second protection film 300 are adhered to the rollable display 100 and the rollable display device 1000 is unrolled from the roller 2000, the rollable display device 1000 does not maintain the curved state, but is unrolled into the substantially flat state.

Accordingly, the rollable display device 1000 that reduces or suppresses deformation due to the stress generated when being rolled to the roller 2000 is provided.

While the present inventive concept has been particularly shown and described with reference to exemplary embodiments thereof, it will be apparent to those of ordinary skill in the art that various changes in form and detail may be made thereto without departing from the spirit and scope of the present inventive concept as defined by the following claims.

What is claimed is:

1. A rollable device comprising: a rollable display device; and a roller extending in a first direction and fixed to a first edge of the rollable display device, wherein the first edge extends in the first direction, wherein the rollable display device includes: a rollable display including a first surface displaying an image and a second surface disposed on another side of the first surface, wherein a first display edge of the rollable display and a portion of the second surface of the rollable display is supported by the roller; a first protection film disposed on the first surface of the rollable display, wherein the first protection film extends beyond the first display edge of the rollable display; a second protection film disposed on the second surface of the rollable display, wherein the second protection film extends beyond the first display edge of the rollable display; a first adhesive layer disposed between the rollable display and the first protection film; a second adhesive layer disposed between the rollable display and the second protection film; and a first adhesion part disposed adjacent to the first display edge of the rollable display and between the first protection film and the second protection film, wherein the first protection film extends beyond a first edge of the first adhesive layer and a first edge of the second adhesive layer adjacent to the first display edge of the rollable display, and wherein the first adhesion part has a larger modulus of elasticity than that of the first adhesive layer and the second adhesive layer.

2. The rollable device of claim 1, wherein
the rollable display further includes a second display edge opposite of the first display edge, and
the second display edge is unrolled away from the roller.

3. The rollable device of claim 1, the first adhesion part extends parallel to the first display edge in the first direction.

4. The rollable device of claim 1, wherein the first adhesion part extends beyond an edge of the first protection film and beyond an edge of the second protection film, and
the first adhesion part is in contact with the edge of the first protection film and the edge of the second protection film.

5. The rollable device of claim 4, wherein the first adhesion part has a T-like shape from a cross-sectional view.

6. The rollable device of claim 1, wherein
the first adhesion part includes an elastomer.

7. The rollable device of claim 1, wherein
at least a portion of a surface of the first protection film in contact with the first adhesion part has protrusions and depressions in an alternating arrangement, and
at least a portion of a surface of the second protection film in contact with the first adhesion part has protrusions and depressions in an alternating arrangement.

8. The rollable device of claim 1, wherein
the first adhesive layer has a greater adhesion strength than that of the first adhesion part, and
the second adhesive layer has a greater adhesion strength than that of the first adhesion part.

9. The rollable device of claim 1, wherein
the first adhesive layer and the second adhesive layer include a pressure sensitive adhesive.

10. A rollable device comprising: a rollable display device; and a roller extending in a first direction and fixed to a first edge of the rollable display device, wherein the first edge extends in the first direction, wherein the rollable display device includes: a rollable display including a first surface and a second surface displaying an image and disposed on another side of the first surface, wherein a first display edge of the rollable display and a portion of the second surface of the rollable display is supported by the roller; a first protection film disposed on the first surface of the rollable display, wherein the first protection film extends beyond the first display edge of the rollable display; a second protection film disposed on the second surface of the rollable display, wherein the second protection film extends beyond the first display edge of the rollable display; a first adhesive layer disposed between the rollable display and the first protection film; a second adhesive layer disposed between the rollable display and the second protection film; and a first adhesion part disposed adjacent to the first display edge of the rollable display and between the first protection film and the second protection film, wherein the first protection film extends beyond a first edge of the first adhesive layer and a first edge of the second adhesive layer adjacent to the first display edge of the rollable display, and wherein the first adhesion part has a larger modulus of elasticity than that of the first adhesive layer and the second adhesive layer.

11. The rollable device of claim 10, wherein
the rollable display further includes a second display edge opposite of the first display edge, and
the second display edge is unrolled away from the roller.

12. The rollable device of claim 10, the first adhesion part extends parallel to the first display edge in the first direction.

13. The rollable device of claim 10, wherein the first adhesion part extends beyond an edge of the first protection film and beyond an edge of the second protection film, and
the first adhesion part is in contact with the edge of the first protection film and the edge of the second protection film.

14. The rollable device of claim 13, wherein the first adhesion part has a T-like shape from a cross-sectional view.

15. The rollable device of claim 10, wherein
the first adhesion part includes an elastomer.

16. The rollable device of claim 10, wherein
at least a portion of a surface of the first protection film in contact with the first adhesion part has protrusions and depressions in an alternating arrangement, and
at least a portion of a surface of the second protection film in contact with the first adhesion part has protrusions and depressions in an alternating arrangement.

17. The rollable device of claim 10, wherein
the first adhesive layer has a greater adhesion strength than that of the first adhesion part, and
the second adhesive layer has a greater adhesion strength than that of the first adhesion part.

18. The rollable device of claim 10, wherein
the first adhesive layer and the second adhesive layer include a pressure sensitive adhesive.

* * * * *